(12) United States Patent
Lillelund (10) Patent No.: US 8,842,858 B2
(45) Date of Patent: Sep. 23, 2014

(54) ELECTRET CONDENSER MICROPHONE

(75) Inventor: Christian Lillelund, Fredensborg (DK)

(73) Assignee: Invensense, Inc., San Jose, CA (US)

( * ) Notice: Subject to any disclaimer, the term of this patent is extended or adjusted under 35 U.S.C. 154(b) by 217 days.

(21) Appl. No.: 13/529,948

(22) Filed: Jun. 21, 2012

(65) Prior Publication Data
US 2012/0321111 A1 Dec. 20, 2012

(51) Int. Cl.
| | |
|---|---|
| H04R 25/00 | (2006.01) |
| H04R 11/04 | (2006.01) |
| H04R 17/02 | (2006.01) |
| H04R 19/04 | (2006.01) |
| H04R 21/02 | (2006.01) |
| H04R 1/00 | (2006.01) |
| H04R 9/06 | (2006.01) |
| H04R 11/02 | (2006.01) |
| H04R 1/04 | (2006.01) |
| H04R 19/01 | (2006.01) |

(52) U.S. Cl.
CPC ............... *H04R 1/04* (2013.01); *H04R 19/016* (2013.01); *H04R 2201/029* (2013.01)
USPC ........... 381/174; 381/175; 381/191; 381/355; 381/357; 381/369; 381/398

(58) Field of Classification Search
CPC .... H04R 19/04; H04R 19/016; H04R 19/005; H04R 19/02; H04R 19/00; H04R 19/01; H04R 1/083; H04R 1/086; H04R 1/08; H04R 1/38; H04R 1/406; H04R 1/222; H04R 23/006; H04R 7/20; H04R 7/18; B81B 2201/0257
USPC ......... 381/174, 191, 355, 357, 369, 175, 398; 367/140, 170, 181; 29/25.41, 594
See application file for complete search history.

(56) References Cited

U.S. PATENT DOCUMENTS

| | | | |
|---|---|---|---|
| 5,097,515 A | 3/1992 | Baba | |
| 5,272,758 A | 12/1993 | Isogami et al. | |
| 6,950,529 B2 | 9/2005 | Wilmink | |
| 7,233,674 B2* | 6/2007 | Song | 381/174 |
| 7,292,696 B2 | 11/2007 | Saeki et al. | |
| 7,352,873 B2* | 4/2008 | Shigeno et al. | 381/113 |
| 7,558,077 B2 | 7/2009 | Awamura | |
| 7,853,027 B2 | 12/2010 | Yamaoka et al. | |

(Continued)

FOREIGN PATENT DOCUMENTS

EP 2224750 A1 9/2010

*Primary Examiner* — Matthew Eason
*Assistant Examiner* — Sean H Nguyen
(74) *Attorney, Agent, or Firm* — Maryam Imam; IPxLaw Group LLP (57) ABSTRACT

The present invention relates to an electret condenser microphone which comprises an exterior sidewall structure attached to a carrier. The exterior sidewall structure comprises a non-conductive base material carrying first and second electrical wiring patterns electrically connected to first and second electrical traces, respectively, of the carrier. A diaphragm holder, carrying a conductive microphone diaphragm is attached to the sidewall structure to establish electrical connection between a conductive microphone diaphragm and one of the first and second electrical wiring patterns of the sidewall structure. A conductive perforated backplate is arranged in spaced relationship to the conductive microphone diaphragm. The conductive perforated backplate is electrically connected to another one of the first and second wiring patterns of the sidewall structure. The sidewall structure may therefore be utilized to provide electrical connectivity from the conductive microphone diaphragm and from the backplate to a microphone preamplifier arranged on the carrier.

16 Claims, 4 Drawing Sheets

(56) References Cited

U.S. PATENT DOCUMENTS

| | | |
|---|---|---|
| 8,043,897 B2 | 10/2011 | Lee et al. |
| 8,135,150 B2 | 3/2012 | Izuchi et al. |
| 8,155,355 B2 * | 4/2012 | Ogura et al. .................. 381/174 |
| 2006/0177085 A1 * | 8/2006 | Izuchi et al. .................. 381/369 |
| 2009/0268930 A1 | 10/2009 | Yuasa et al. |
| 2010/0027817 A1 * | 2/2010 | Dyer et al. .................... 381/191 |
| 2013/0044899 A1 * | 2/2013 | Barber et al. ................. 381/113 |

* cited by examiner

ELECTRET CONDENSER MICROPHONE

The present invention relates to an electret condenser microphone which comprises an exterior sidewall structure attached to a carrier. The exterior sidewall structure comprises a non-conductive base material carrying first and second electrical wiring patterns electrically connected to first and second electrical traces, respectively, of the carrier. A diaphragm holder, carrying a conductive microphone diaphragm is attached to the sidewall structure to establish electrical connection between a conductive microphone diaphragm and one of the first and second electrical wiring patterns of the sidewall structure. A conductive perforated backplate is arranged in spaced relationship to the conductive microphone diaphragm. The conductive perforated backplate is electrically connected to another one of the first and second wiring patterns of the sidewall structure. The sidewall structure may therefore be utilized to provide electrical connectivity from the conductive microphone diaphragm and from the backplate to a microphone preamplifier arranged on the carrier.

BACKGROUND OF THE INVENTION

The invention concerns an electret condenser microphone (ECM) with a new simplified housing construction. Miniature ECMs are currently in widespread use in portable communication terminals and computing devices for consumer and professional applications. ECMs are capacitor microphones which rely on a permanently charged electret layer arranged on the back plate of the ECM to provide a DC bias voltage for the capacitive transducer element. The permanently charged electret layer can for example be a Teflon layer wherein electrical charges are injected and permanently trapped. Miniature ECMs are sold in very large quantities for numerous highly cost-sensitive consumer applications which make costs considerations very important. Measures that can be taken to reduce manufacturing costs for example in terms of utilized manufacturing technology, manufacturing operations and component costs are accordingly of great interest and importance.

U.S. Pat. No. 5,272,758 discloses an ECM which comprises a cylindrical metallic housing or capsule. The cylindrical microphone housing comprises an integrally formed top plate or lid having a plurality of through-going sound holes. The inner surface of the entire cylindrical housing, including the top lid, comprises an electret polymer film. A conductive diaphragm is mounted to a cylindrical metallic diaphragm holding member in spaced relationship to the back plate in the top lid. The electret polymer film establishes electrical contact to wire traces on the bottom portion of the wiring board or substrate whereon an IC device is attached. The cylindrical metallic diaphragm holding member is used to establish electrical contact between the conductive diaphragm and the IC device through wire traces on the wiring board.

U.S. 2009/0268930 A1 discloses an ECM with a cylindrical metallic housing or capsule. A conductive diaphragm is mounted to a cylindrical metallic ring or carrier. A perforated back plate comprises an electret layer facing outwardly of the ECM relative to the conductive diaphragm. Electrical connection in vertical direction between the conductive diaphragm and a FET amplifier, mounted on a PCB carrier, is established by an electrical conductive ring contacting a wire trace on the PCB carrier. An opposite surface of the electrical conductive ring contacts the cylindrical metallic ring functioning as a diaphragm holder. Vertical electrical contact between (ground of) the FET amplifier and the back plate is effected through the cylindrical metallic housing.

U.S. Pat. No. 8,043,897 B2 discloses MEMS microphones and MEMS microphone packages and assembly methods for production of the latter in batches.

Accordingly, there is a need in the art for improved ECMs which can reduce manufacturing costs without sacrificing important performance metrics such as electroacoustic sensitivity, frequency response, noise level and housing volume. ECMs in accordance with the present invention provide numerous advantages such as lower parts count, simplified assembly process, enlarged back chamber volume etc. Furthermore, a housing structure of the present ECM may be built by a reduced number of separate components fabricated by the application of printed circuit board technology to take advantage of the sophisticated capabilities and low cost of today's printed circuit board technology.

SUMMARY OF THE INVENTION

According to a first aspect of invention there is provided an electret condenser microphone comprising a carrier which comprises first and second electrical traces. The carrier further comprises an upper surface holding a microphone preamplifier with an audio input electrically connected to the first electrical trace. The electret condenser microphone additionally comprises an exterior sidewall structure attached to the carrier to surround the microphone preamplifier and comprising a non-conductive base material carrying a first electrical wiring pattern and a second electrical wiring pattern. The first and second electrical wiring patterns being electrically connected to the first and second electrical traces, respectively, of the carrier. A diaphragm holder, carrying a conductive microphone diaphragm, is attached to the exterior sidewall structure to establish electrical connection between the conductive microphone diaphragm and one of the first and second electrical wiring patterns. A conductive perforated backplate comprises a permanently charged electret layer and the conductive perforated backplate comprises a peripheral portion supported by the sidewall structure to electrically connect the conductive perforated backplate to another one of the first and second wiring patterns of the sidewall structure and place the conductive perforated backplate in spaced relationship to the conductive microphone diaphragm.

The exterior sidewall structure carries or supports the first and second electrical wiring patterns which each may be arranged at an outer or inner surface of the exterior sidewall structure or buried inside the exterior sidewall structure. The exterior sidewall structure functions as an intermediate coupling member between the conductive perforated backplate and the conductive microphone diaphragm arranged in the spaced relationship at an upper portion of the exterior sidewall structure. The carrier is arranged at a lower portion of the exterior sidewall structure for example in abutment with at a lowermost edge surface of the sidewall structure. The exterior sidewall structure provides in an advantageous manner both mechanical coupling and electrical connection or coupling between each of the conductive perforated backplate and the conductive microphone diaphragm and the carrier. The external sidewall structure eliminates the need for separate conductive members such as metallic springs or rings to connect the microphone diaphragm to the appropriate wire traces on the carrier. This leads to an ECM design with fewer parts and increased back chamber volume. Furthermore, parasitic capacitances associated with the electrical wiring between the conductive microphone diaphragm and the preamplifier audio input may be reduced because the first and second electrical wiring patterns can be routed in a flexible manner with good spatial separation on, or inside, the sidewall structure. The first and second electrical wiring patterns which are electrically connected to the conductive perforated backplate and the conductive microphone diaphragm, respectively, are connected to the first and second electrical traces of the carrier, respectively, or vice versa. The audio input of the microphone preamplifier may for example be electrically coupled to the conductive microphone diaphragm through the first wiring pattern and the perforated conductive backplate electrically coupled to a ground node of the microphone preamplifier through the second wiring pattern of the sidewall structure. The ground node may be an analog ground node of the microphone preamplifier. If the microphone preamplifier comprises a differential input stage with first and second differential inputs, the audio input may be the first differential input and the perforated conductive backplate may be electrically coupled to the second differential input. In another embodiment, the exterior sidewall structure comprises a third electrical wiring pattern, insulated from the first and second electrical wiring patterns and disposed as a conductive layer or coating on an outwardly facing surface of the exterior sidewall structure. The third electrical wiring pattern may be electrically connected to a digital ground node of the microphone preamplifier through a mating trace on, or in, the carrier. Accordingly, the third electrical wiring pattern may be utilized to shield the first and second electrical wiring patterns and the audio input of the microphone preamplifier from external EMI noise.

In a preferred embodiment, the carrier, the sidewall structure and the lid structure are arranged to form a substantially closed microphone housing comprising at least one sound port extending through the lid portion allowing sound propagation to the conductive microphone diaphragm. The substantially closed microphone housing may possess a substantially circular or rectangular outer contour. The width may be less than 5 mm and a length less than 6 mm for a substantially rectangular microphone housing contour.

The exterior sidewall structure may be fabricated in different types of material and associated manufacturing processes. In some embodiments, the exterior sidewall structure may manufactured by injection molding such that the non-conductive base material comprises a thermoplastic resin or compound suitable for injection molding processes. The first and second electrical wiring patterns may subsequently be developed by depositing electrical conductive material inside, or on, wall surfaces of the injection molded non-conductive base material. The exterior sidewall structure may in the alternative be manufactured by insert molding where appropriately shaped electrical conductors are fused into a thermoplastic resin or compound in a mold. In yet another embodiment, the exterior sidewall structure is formed by 3D printing technology such as stereolithography by employing an amount of liquid ultraviolet curable photopolymer "resin" which is illuminated with an ultraviolet laser to build the wall structure in layers one at a time. In yet another embodiment, the exterior sidewall structure comprises a printed circuit board (PCB) such that the non-conductive or insulating base material may comprise FR-4 or similar composite material composed of woven fiberglass with an epoxy resin binder. The printed circuit board sidewall structure is particularly advantageous because conventional PCB fabrication technologies allow the exterior sidewall structure to be manufactured with good dimensional accuracy and stability in large volumes at low-costs.

According to one embodiment of the invention, the perforated conductive backplate is formed by a separate element placed below the conductive microphone diaphragm such that the latter is closest to the sound port or inlet in the lid structure. In this embodiment, the perforated conductive backplate preferably comprises a traditional backplate structure with a large number of holes or perforations formed in a flat grid or grille like structure of the backplate.

In a number of alternative embodiments, the perforated conductive backplate is integrally formed with a lid structure of the closed microphone housing to arrange the conductive perforated backplate above the conductive microphone diaphragm. The lid structure preferably comprises only a single or a few through-going sound ports or inlets for the electret condenser microphone allowing sound to propagate to the conductive microphone diaphragm. Consequently, according to these embodiments, the perforations of the conductive perforated backplate are provided by the single or few through-going sound ports of the lid structure such that the above-mentioned traditional backplate structure placed below the conductive diaphragm is eliminated. The traditional backplate structure may induce an undesired acoustic resistance to the electroacoustic characteristics of the microphone which leads to additional microphone noise.

The lid structure is preferably formed as a separate member which is attached to an upper circumferential edge of the sidewall structure during microphone manufacturing such that the integrally formed conductive perforated backplate is placed in the desired spatial relationship to the conductive microphone diaphragm across an intervening air gap. The lid structure may conveniently comprise a substantially flat printed circuit board having an inwardly facing metallized surface supporting the electret layer. The metallized layer is coupled to the second wiring pattern of the exterior sidewall structure. This lid structure can be manufactured by the application of ordinary PCB manufacturing technologies leading to numerous advantages as described in additional detail below. The electret layer may comprise a thin Teflon film bonded to the inwardly facing metallized surface of the flat printed circuit board of the lid structure.

In an alternative embodiment, where the conductive perforated backplate likewise is arranged above the conductive microphone diaphragm, the lid structure comprises a metal lid having an inwardly facing surface supporting the electret layer.

The skilled person will understand that the diaphragm holder may be formed by a separate element or structure to which the conductive microphone diaphragm is bonded or attached before the unitized structure is attached to the sidewall structure. However, in other embodiments, the diaphragm holder may be integrally formed with the sidewall structure for example where the latter comprises a suitably shaped and sized ridge or shoulder. In the latter embodiment, the conductive microphone diaphragm may be bonded directly to the ridge or shoulder of the sidewall structure.

To establish electrical and mechanical contact between the carrier and the exterior sidewall structure these may are bonded to each other with one of an electrically conductive adhesive and solder bumps arranged on respective exposed terminals or pads of the first and second electrical traces of the carrier and appropriately aligned and exposed pads of the first and second wiring patterns at the lower surface portion or edge of the exterior sidewall structure.

The skilled person will understand that at least one of the carrier, the sidewall structure and the lid structure preferably comprises a single-layer or multi-layer printed circuit board. In certain embodiments, each of the carrier, the sidewall structure and the lid structure comprises a printed circuit board. The use of the same type of material for the fabrication of the carrier, the sidewall structure and the lid structure leads to low manufacturing costs. In addition, the ECM design will possess good dimensional stability due to the elimination of differences in thermal expansion coefficients of different components of the ECM.

In a preferred embodiment, the exterior sidewall structure comprises a flat closed frame comprising an inner circumferential edge, an outer circumferential edge, an upper surface area and a lower opposing surface area. One of the first and second electrical wiring patterns comprises one or more through via(s) extending between the upper and lower surface areas. The one or more through via(s) may be exposed at the inner circumferential edge of the flat closed frame. In an advantageous embodiment, the flat closed frame comprises a printed circuit board (PCB) such as a multi-layer PCB. The one or more through via(s) may be formed as, or comprise, one or more through hole(s) formed in the circuit board of the flat closed frame. The second wiring pattern preferably comprises an exterior metallized layer covering the outer circumferential edge of the sidewall structure. As previously explained, the exterior metallized layer can be utilized to shield the audio input of the microphone preamplifier, electrical wiring and components of the interior of the microphone housing from external EMI noise. The skilled person will understand that the EMI shielding may be further improved by the formation of additional metallized layers covering outer surfaces of the carrier and the lid structure. These additional metalized layers are preferably electrically connected to the exterior metallized layer on the outer circumferential edge of the sidewall structure such that a substantially coherent electrical shield covers the outer surface of the substantially closed microphone housing.

A capacitive transducer element of the ECM is formed by the spaced relationship between the conductive perforated backplate and the conductive microphone diaphragm. The capacitive transducer element may exhibit an extremely large generator impedance, essentially corresponding to a capacitor with a value between 0.5 and 5 pF for miniature ECMs for portable communication devices. To support these range of impedances of the capacitive transducer elements, the microphone preamplifier preferably posses an input impedance, at the audio input which is larger than 100 MΩ, preferably larger than 1 GΩ, even more preferably larger than 10 GΩ, measured at 1 kHz. The input impedances in the ranges outlined above can for example be accomplished by an appropriate choice of semiconductor process technology for the present microphone preamplifier for example by using MOS, CMOS or BiCMOS technology, and/or appropriate circuit design techniques. The microphone preamplifier may be integrated on a semiconductor die or circuit which is attached to the upper surface of the carrier and electrically connected to the first and second wire traces by one of wire bonding and flip-chip mounting, e.g. via bumps or stud bumps. The semiconductor die may therefore be mechanically and electrically coupled to the carrier such that electrical connection is established between the audio input and the first electrical trace and between the second electrical trace and a power supply node or a ground node of the microphone preamplifier.

Another aspect of the invention relates to a method of manufacturing a housing for an electret condenser microphone, comprising steps of:

a) producing an electronic component carrier having disposed thereon first and second mutually insulated electrical traces,
b) manufacturing a substantially flat printed circuit board having an upper surface and an opposing lower surface,
c) providing in the flat printed circuit board a first vertical electrical wiring pattern extending between the upper surface and opposing lower surface,
d) providing in the flat printed circuit board a second vertical electrical wiring pattern extending between the upper surface and opposing lower surface,
e) cutting out, e.g. by punching, stamping, drilling, laser cutting, an inner portion of the flat printed circuit board along a predetermined perimeter to produce a flat printed circuit board frame having an inner peripheral edge,
f) manufacturing a second substantially flat printed circuit board having an upper surface and an opposing lower surface comprising and electrically conductive layer,
g) depositing a permanently charged electret layer on the electrically conductive layer,
h) providing a diaphragm assembly comprising a conductive microphone diaphragm fastened to a diaphragm holder,
i) fastening the flat printed circuit board frame to an outer periphery of the upper surface of the carrier to electrically connect the first and second mutually insulated electrical traces to the first and second first and second vertical electrical wiring patterns of the flat printed circuit board,
j) fastening the diaphragm assembly to the inner peripheral edge of the flat printed circuit board frame,
k) fastening the second substantially flat printed circuit board to the flat printed circuit board frame with an inwardly oriented electret layer.

The method of manufacturing a housing for an electret condenser microphone preferably comprises an additional step of cutting-out a through-going sound port in the second substantially flat printed circuit board. In this manner, the housing of the electret condenser microphone may be provided by as few as three separate components or parts, i.e. the electronic component carrier, the flat printed circuit board frame and the second substantially flat printed circuit board such that the flat printed circuit board frame forms and intermediate coupling member and the second substantially flat printed circuit board forms a lid structure of the microphone housing with an integral perforated backplate. The ECM may be finished by a further step of mechanically and electrically coupling a microphone preamplifier to the first and second mutually insulated electrical traces of the carrier by conventional coupling technology such as wire-bonding or flip-chip mounting

BRIEF DESCRIPTION OF THE DRAWINGS

Embodiments of the invention will be described in more detail in connection with the append drawings in which:

FIGS. 4A) and 4B) depict respective embodiments of a printed circuit board based sidewall structure for use in the ECMs according to the first and second embodiments of the invention.

DESCRIPTION OF PREFERRED EMBODIMENTS

Figure 1:
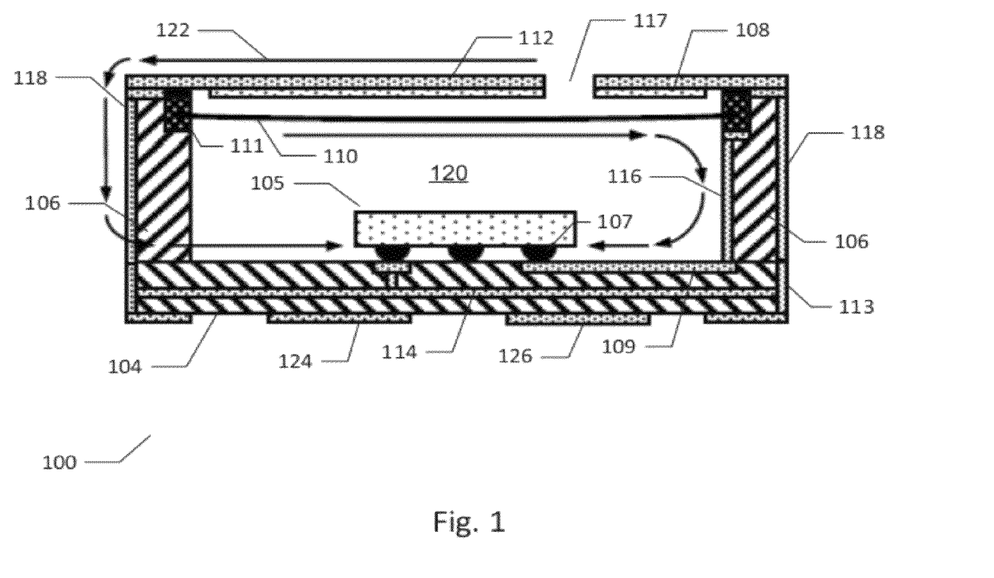
FIG. 1 is a vertical cross-sectional view of an ECM according to a first embodiment of the invention, FIG. 2A) is vertical cross-sectional view of an ECM according to a second embodiment of the invention, FIG. 2B) is vertical cross-sectional view of an ECM according to a third embodiment of the invention.

FIG. 1 is a vertical cross-sectional view of an electret condenser microphone (ECM) 100 according to a first embodiment of the invention. The ECM 100 comprises a carrier 104 that may comprise a single layer or multi-layer printed circuit board or a ceramics substrate. The carrier 104 comprises first and second mutually insulated electrical traces or wires. The first electrical trace 109 is disposed on an upper surface of the carrier 104 also carrying or supporting a microphone preamplifier 105. A microphone preamplifier is provided on a semiconductor die or substrate 105. The microphone preamplifier may be integrated on an Application Specific Integrated Circuit (ASIC) fabricated in a sub-micron CMOS semiconductor process technology. The semiconductor die 105 is attached to the upper surface of the carrier 104 through a set of preamplifier pads or terminals which mate to a set of carrier pads A first preamplifier terminal 107 is an audio input of the microphone preamplifier 105 and the audio input is electrically connected to the first electrical trace 107 through the carrier pad. A second electrical trace 114 comprises an intermediate layer of the carrier 104 and is coupled to a second preamplifier terminal through a vertical conductor via or segment establishing electrical coupling between the carrier pad and the second electrical trace 114. The second electrical trace 114 furthermore comprises a circumferential metalized layer or ring 113 arranged as the outer edge portion of the carrier 104. A lower exterior surface of the carrier 104 comprises first and second externally accessible terminals, 124, 126, respectively, of the ECM 100. The first and second externally accessible terminals, 124, 126 are used for electrically coupling the ECM 100 to an application board for example a printed circuit board of a mobile terminal. The first externally accessible terminal 124 may provide an audio output signal of the microphone preamplifier and the second externally accessible terminal 126 may comprise a power supply voltage for the microphone preamplifier for example a DC voltage between 1.2 and 3.5 Volts. Furthermore, the circumferential wire portion 113 of the carrier 104 may be used as an external terminal of the ECM 100 coupling the ground potential thereof to a ground potential or plane of the application board.

The ECM 100 further comprises an exterior sidewall structure 106 attached to a peripheral portion of the upper surface of carrier 104 so as to surround the microphone preamplifier 105. The exterior sidewall structure 106 carries or supports a first electrical wiring pattern or trace 116 electrically connected to a conductive diaphragm holder 111 through an upper exposed portion of the trace 116. A lower portion of the first electrical trace 116 is electrically coupled to the first electrical trace 109 attached to the upper surface of the carrier 104 such that the diaphragm holder 111 and a conductive microphone diaphragm 110 are both electrically coupled to the audio input of the microphone preamplifier 105. The exterior sidewall structure 106 furthermore comprises a second electrical trace or wiring pattern 118 formed as a circumferential metalized layer at the outer circumferential edge of the exterior wall structure. The second electrical wiring pattern 118 is preferably electrically coupled to an AC ground node such as analog ground of the ECM 100 to provide EMI shielding of the microphone preamplifier and associated wiring. The diaphragm holder 111 is attached to and rests against a circumferential horizontal (i.e. extending parallely to the diaphragm plane) shelf formed in an inner surface of the sidewall structure 106. The electrical connection between the diaphragm holder 111 and the upper exposed portion of the first electrical wire 116 may be established by various attachment means such as press-fitting, solder, a conductive adhesive agent etc.

The exterior sidewall structure 106 may be fabricated in different materials and manufacturing technologies appropriate for the production of a suitably formed non-conductive base material with predetermined vertical electrical wiring traces or patterns coupling the backplate and the conductive microphone diaphragm 110 to the first and second electrical traces disposed in, or on, the carrier 104. In the present embodiment, the exterior sidewall structure 106 comprises a flat closed frame formed in printed circuit board material as described below in further detail below.

A conductive perforated backplate is integrally formed with a lid structure 112 of the ECM 100. The lid and backplate structure 112 is formed as a separate element of the ECM 100 and attached to the sidewall structure 106 during fabrication or assembly of the ECM 100. The lid structure 112 comprises a substantially plane metal lid having an inwardly facing surface supporting a permanently charged electret layer 108 such that the electret layer 108 faces the conductive microphone diaphragm 110 across an intervening air gap. The electret layer 108 and the conductive microphone diaphragm 110 are preferably arranged substantially parallel to each other with a height of the air gap between 20 and 50 μm. The lid structure 112 may comprise one or more sound ports 117 or inlets such that the backplate is provided with a perforated pattern or structure allowing sound to propagate to the conductive microphone diaphragm 110. A peripheral portion of the metallic lid structure 112 is attached to a topmost exposed portion of the second electrical wiring pattern 118 such that the backplate and lid is electrically connected to the second electrical trace 114 of the carrier 104.

The skilled person will appreciate that the carrier 104, the exterior sidewall structure 106 and the lid structure 112 are arranged to form a substantially closed microphone housing of the ECM 100. The lid structure 112 of the microphone housing comprises one or more sound port(s) 117 allowing passage of sound to the conductive microphone diaphragm 110. A back chamber 120 of the microphone housing is formed below the conductive microphone diaphragm 110. The volume of the back chamber 120 determines a compliance of the microphone diaphragm 110 and therefore has significant influence on the electroacoustic performance of the ECM 100. The semiconductor die 106, which is mechanically and electrically attached to the upper surface of the carrier 104 by flip-chip mounting, is also housed within the back chamber 120. While the flip-chip mounting of the semiconductor die 106 provides a minimal footprint on the upper surface of the carrier 104, the skilled person will appreciate that alternative types of mounting technologies may be utilized in other embodiments of the ECM 100 for example wire bonding techniques or packaging technology.

Figure 2:
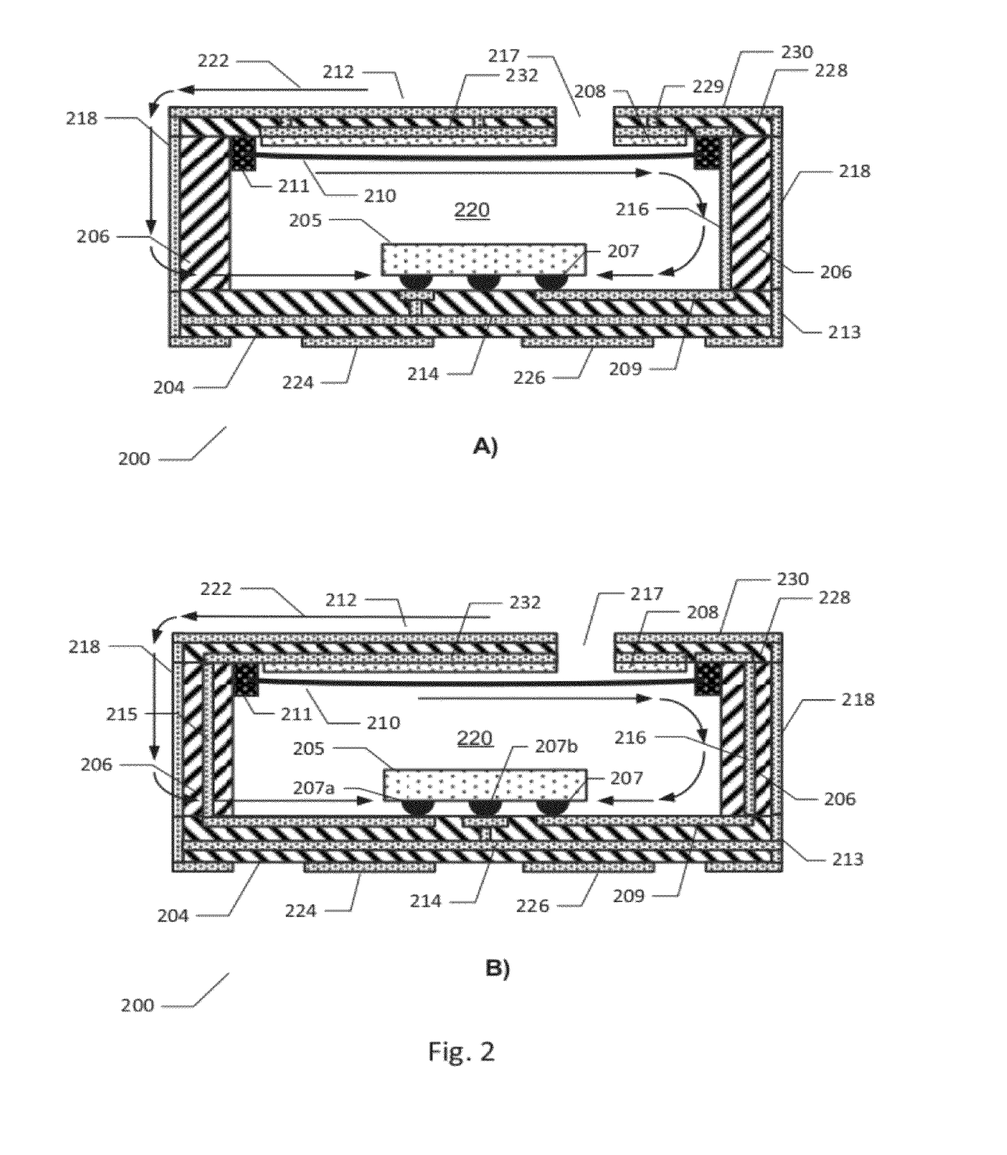

FIG. 2A) is a vertical cross-sectional view of an electret condenser microphone (ECM) 200 according to a second embodiment of the invention. Corresponding features, elements and components of the first and second embodiments of the invention 100, 200, respectively, have been provided with corresponding reference numerals to ease comparison.

The main difference between the ECM 200 and the previously discussed ECM 100 is that the lid structure 212 of the present ECM 200 comprises a substantially flat printed circuit board with metallized surfaces in contrast to the metal lid of the ECM 100. The printed circuit board comprises an inwardly facing metallized layer 232 supporting a permanently charged electret layer 208 and an outwardly facing metallized layer 230 forming an effective EMI shielding surface at the exterior of the ECM housing. The inwardly facing metallized layer 232 is electrically coupled to the outwardly facing metallized layer 230 through a vertical via or conductor segment 229 as illustrated such that the backplate is effectively coupled to a ground potential of the ECM 200. The sound port(s) 217 of the lid structure 212 can conveniently be formed by a conventional PCB process such as drilling, stamping, laser cutting etc. The printed circuit board comprises a non-conductive base material 228 of conventional structure and characteristics such as FR-4 or similar composite material composed of woven fiberglass with an epoxy resin binder. Accordingly, the present lid structure 212 can be fabricated as a separate member by exploiting conventional and highly sophisticated printed circuit board technology to provide a low-cost component with good dimensional accuracy and stability. The permanently charged electret layer 208 may be deposited on the inwardly facing metallized layer 232 as a thin Teflon film bonded to the metallized layer 232. This step may exploit batch processing where a large sheet of the thin Teflon film is bonded to a correspondingly sized piece of flat printed circuit board. Subsequently, the present lid structure 212 is formed by dicing or stamping to the unitized plate of PCB and Teflon film to produce a plurality of lid structures during a single manufacturing step.

FIG. 2B) is a vertical cross-sectional view of an electret condenser microphone (ECM) 200 according to a third embodiment of the invention. Corresponding features, elements and components of the second and third embodiments of the invention have been provided with identical reference numerals to ease comparison. The main difference between the present ECM and the previously discussed ECM, depicted on FIG. 2a), is that the inwardly facing metallized layer 232 of the lid structure 212 is electrically insulated from the outwardly facing metallized layer 230 because the vertical via or conductor segment 229 has been eliminated. The outwardly facing metallized layer 230 still forms an effective EMI shielding surface at the exterior of the ECM housing. However, in the present embodiment, the outwardly facing metallized layer 230 is electrically coupled to a digital ground terminal or pad 207b of the microphone preamplifier integrated on the ASIC 205 through the second electrical trace 218. The inwardly facing metallized layer 232, which is a part of the backplate structure, is coupled to an analog ground input or potential at terminal 207a of the microphone preamplifier through a third electrical trace 215 provided inside the exterior sidewall structure 206. This electrical insulation of analog ground potential and digital ground potential may be effective in shielding the sensitive analog microphone input signal associated with the backplate structure from the EMI noise of the external environment. In the present embodiment, EMI noise is conducted through the peripheral portion of the microphone housing including trace or layer 218 directly to the digital ground node 207b of the microphone preamplifier. Finally, it should be mentioned that the inwardly facing metallized layer 232 in the alternative may be coupled to a microphone input instead of to the analog ground terminal 207a if the microphone preamplifier comprises a differential input stage. In this manner, the microphone audio signal developed between the conductive microphone diaphragm 210 and the perforated backplate structure in response to incoming sound could be coupled differentially to the input of microphone preamplifier through the terminals 207 and 207a to attenuate common mode noise.

Figure 3:
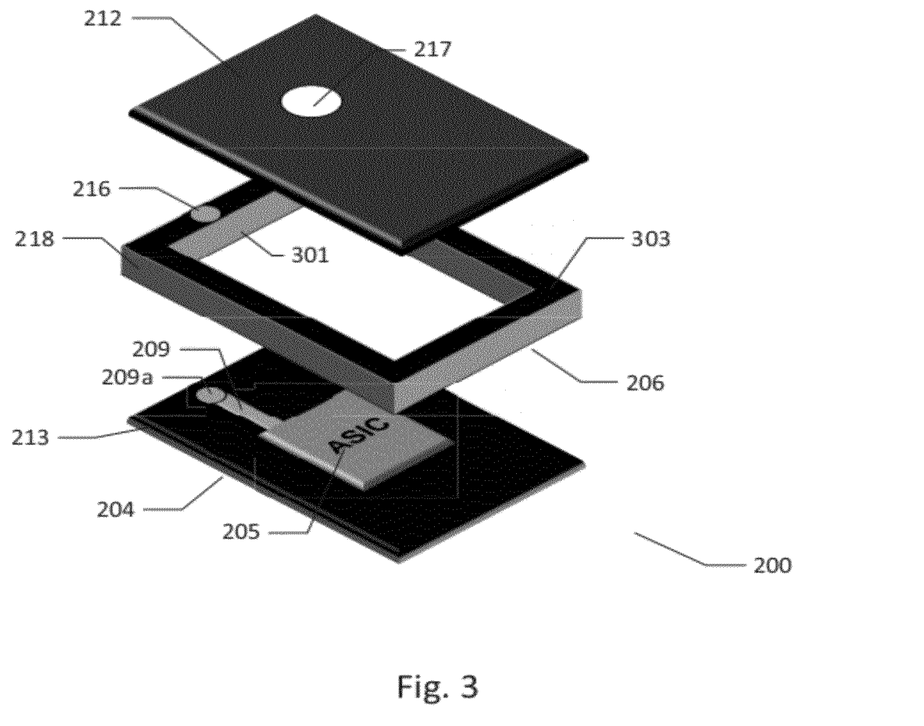
FIG. 3 is a schematic exploded view of the ECM according to the second embodiment of the invention.

FIG. 3 is a schematic exploded view of the ECM 200 described above in accordance with the second embodiment of the invention. The ECM housing is formed exclusively by three separate members, i.e. the carrier 204, the exterior sidewall structure 206 and the lid structure 212 which jointly form a substantially closed microphone housing. Furthermore, each of the carrier 204, the exterior sidewall structure 206 and the lid structure 212 is preferably fabricated in PCB material using conventional PCB manufacturing processes and technology to provide a low-cost housing structure. Furthermore, electrical wiring patterns provided on the outside surfaces of, or inside, the exterior sidewall structure 206 provide electrical interconnection between the conductive microphone diaphragm 210 (refer to FIG. 2) and the backplate structure, formed integrally with the lid structure 212, and the microphone preamplifier integrated on the ASIC 205. The adaptation of the exterior sidewall structure 206 to provide this type of electrical connectivity provides numerous advantages such as reducing the number of separate components of the ECM 200, leaving a larger back chamber volume (item 220 on FIG. 2) and may reduce parasitic capacitances associated with the electrical wiring between the conductive microphone diaphragm 210 and the preamplifier audio input.

In the present embodiment, the exterior sidewall structure 206 is formed as a flat closed frame made of printed circuit board material as described below in further detail. The flat closed PCB frame 206 or PCB frame comprises an inner circumferential edge 301 and an outer circumferential edge covered by the second electrical wiring pattern 218 formed as a circumferential metalized layer as explained above in connection with the corresponding structure of the first embodiment of the invention. The PCB frame 206 comprises an upper surface area 303 and a lower opposing surface area (not shown) wherein the upper surface area is attached to a circumferential portion of the PCB lid structure 212 for example by a suitable adhesive agent. The lower surface area of the PCB frame 206 is likewise attached to a circumferential portion of the upper surface of the carrier 204 for example by a suitable adhesive agent. The mechanical coupling between each of the PCB lid structure 212 and the carrier 204 is preferably made in an acoustical sealed manner such that sound is only allowed to propagate into the microphone housing only through the sound port 217. A through via 216 forms the previously discussed first electrical wire of the sidewall structure and extends vertically through the PCB frame 206 so as to provide electrical connectively between the upper and lower surface areas of the PCB frame 206. At its lower surface, the through via 216 is aligned with a carrier conductor pad or terminal 209a arranged on the upper surface of the carrier 204 to establish electrical connection thereto in the assembled state of the microphone housing. A stable electrical connection between these components may be ensured by disposing a soldering agent or a conductive adhesive agent on the carrier conductor pad or terminal 209a. As mentioned in connection with the first embodiment of the ECM 100, the upper end of the through via 216 comprises an exposed portion or pad which is electrically connected to the conductive diaphragm holder 211 (refer to FIG. 2) and the microphone diaphragm 210 in the assembled state of the microphone housing and ECM 200. Consequently, the microphone diaphragm 210 is electrically coupled to the audio input of the microphone preamplifier through the first electrical trace 209. The skilled person will appreciate that the formation and location of the through via 216 in the PCB frame 206 may be different in other embodiments of the invention. Likewise, a plurality of additional through vias may be arranged in other sections of the PCB frame 206 for example to reduce a resistance of the conductive path through the PCB frame or improve reliability etc.

Figure 4:
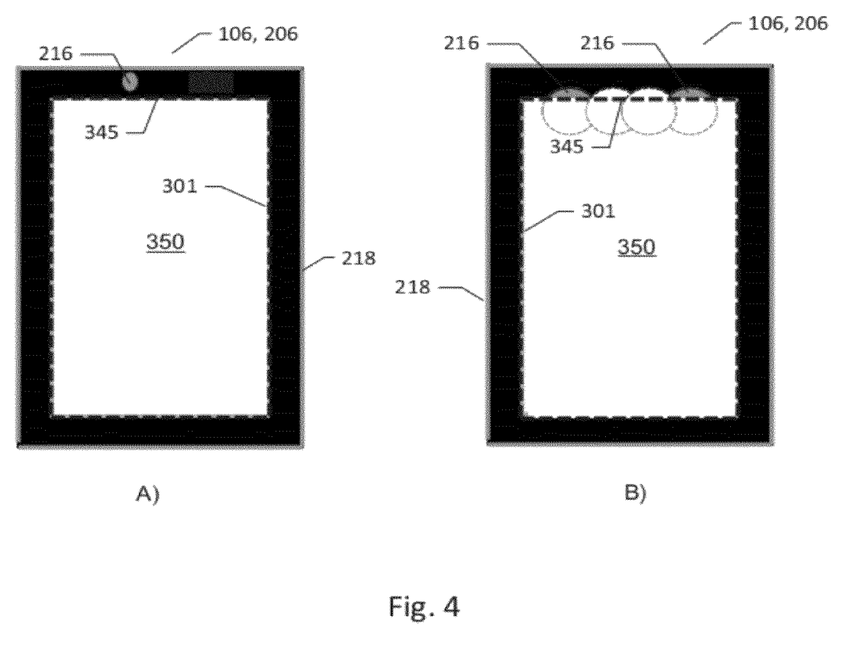

FIG. 4A) depicts a first embodiment of the printed circuit board based sidewall structure 106, 206 for use in the ECMs 100, 200 according to the above described first and second embodiments of the invention. The sidewall structure formed by the PCB frame 106, 206 comprises the earlier discussed through via 216 that is embedded inside the frame printed circuit board material such that the through via 216 is electrically insulated from the outer circumferential edge and from the inner circumferential edge 301 of the PCB frame, i.e. the through via is not electrically exposed at the inner edge 301. The PCB frame is preferably manufactured by firstly manufacturing a substantially flat printed circuit board with outer dimensions identical to those of the PCB frame 106, 206. The substantially flat printed circuit board has an upper surface and an opposing lower surface. The thickness of the flat printed circuit board may lie between 0.5 mm and 3 mm. In connection with the manufacturing of the flat printed circuit board, the through via 216 is formed for example as a plated through hole or a solid conductor using ordinary PCB manufacturing techniques. Likewise, the metallized layer 218 is deposited on the outer circumferential edge of the PCB frame 106, 206 to provide a second vertical electrical wiring pattern extending between the upper and lower surfaces and electrically insulated from the through via 216. Thereafter, the frame structure is created by cutting out, e.g. by punching, stamping, drilling, laser cutting etc., an inner portion or island 350 of the flat printed circuit board along a predetermined perimeter, as indicated by broken line 345, to produce the flat PCB frame 106, 206.

FIG. 4B) depicts a second embodiment of the printed circuit board based sidewall structure 106, 206 for use in the ECMs 100, 200. The sidewall structure is formed by the PCB frame 106, 206 which is manufactured as described above in connection with FIG. 4A) except for the arrangement of the through vias 216. In the present PCB frame 106, 206, the through vias 216 comprise plated through holes arranged across the predetermined perimeter 345 of the above-described cut-out of the inner PCB portion 350. Consequently, after the cutting operation, the through vias 216 are left exposed at the inner circumferential edge 301 of the PCB frame 106, 206 so as to provide the first electrical wire or trace 116, 216 depicted on FIGS. 1 and 2.

The PCB frame 206 additionally comprises the second electrical trace or pattern 218 formed as a circumferential metalized layer at the outer circumferential edge of the exterior wall structure. The one or more through via(s) 216 are accordingly physically separated and electrically insulated from second electrical trace or pattern 218 by printed circuit board material. The second electrical trace or pattern 218 is used to create electrical coupling between the circumferential metalized ring 213 (refer to FIG. 2) of the carrier and the lid structure 212 (refer to FIG. 2) with its integrally formed perforated backplate.

The outer dimensions of the ECM 110, 200 may vary between different types of applications and associated electroacoustic performance requirements. In a number of useful embodiments targeted at portable terminals such as mobile phones or smartphones, the microphone housing possesses the illustrated substantially rectangular outer contour with width less than 5 mm and a length less than 6 mm for example a width of about 3 mm and a length of about 4 mm.

The invention claimed is:

1. An electret condenser microphone comprising:
a carrier comprising first and second electrical traces, and an upper surface holding a microphone preamplifier with an audio input electrically connected to the first electrical trace;
an exterior sidewall structure attached to the carrier to surround the microphone preamplifier and comprising a non-conductive base material carrying a first electrical wiring pattern and a second electrical wiring pattern, the first and second electrical wiring patterns being electrically connected to the first and second electrical traces, respectively, of the carrier;
a diaphragm holder, carrying a conductive microphone diaphragm, attached to the sidewall structure to establish electrical connection between the conductive microphone diaphragm and one of the first and second electrical wiring patterns; and
a conductive perforated backplate comprising a permanently charged electret layer,
wherein the conductive perforated backplate comprises a peripheral portion supported by the sidewall structure to electrically connect the conductive perforated backplate to another one of the first and second wiring patterns of the sidewall structure and place the conductive perforated backplate in spaced relationship to the conductive microphone diaphragm.

2. The electret condenser microphone according to claim 1, wherein the perforated conductive backplate is integrally formed with a lid structure of a microphone housing to arrange the conductive perforated backplate above the conductive microphone diaphragm.

3. The electret condenser microphone according to claim 2, wherein the lid structure is formed as a separate member attached to an upper circumferential edge of the sidewall structure.

4. The electret condenser microphone according to claim 3, wherein the lid structure comprises a substantially flat printed circuit board having an inwardly facing metallized surface supporting the electret layer.

5. The electret condenser microphone according to claim 3, wherein the lid structure comprises a metal lid having an inwardly facing surface supporting the electret layer.

6. The electret condenser microphone according to claim 1, wherein:
the exterior sidewall structure comprises a flat closed frame comprising an inner circumferential edge, an outer circumferential edge, an upper surface area and a lower opposing surface area; and
one of the first or second electrical wiring pattern comprises one or more through via(s) extending between the upper and lower surface areas.

7. The electret condenser microphone according to claim 6, wherein the one or more through via(s) are exposed at the inner circumferential edge of the flat closed frame.

8. The electret condenser microphone according to claim 6, wherein the flat closed frame comprises a printed circuit board (PCB).

9. The electret condenser microphone according to claim 8, wherein the one or more through via(s) comprises a through hole.

10. The electret condenser microphone according to claim 8, wherein at least one of the carrier, the sidewall structure and the lid structure comprises a multi-layer printed circuit board.

11. The electret condenser microphone according to claim 1, wherein the audio input of the microphone preamplifier is electrically coupled to the conductive microphone diaphragm through the first wiring pattern of the sidewall structure and the perforated conductive backplate electrically coupled to an AC ground node of the microphone preamplifier through the second wiring pattern of the sidewall structure.

12. The electret condenser microphone according to claim 11, wherein the second wiring pattern comprises an exterior metallized layer partly covering the outer circumferential edge of the sidewall structure.

13. The electret condenser microphone according to claim 1, wherein the microphone preamplifier is integrated on a semiconductor die or circuit,
   the semiconductor die being attached to the upper surface of the carrier and electrically connected to the first and second wire traces by one of wire bonding and flip-chip mounting.

14. The electret condenser microphone according to claim 1, wherein the carrier, the sidewall structure and the lid structure are arranged to form a substantially closed microphone housing comprising at least one sound port extending through the lid portion allowing sound propagation to the conductive microphone diaphragm.

15. The electret condenser microphone according to claim 14, wherein the substantially closed microphone housing has a substantially rectangular outer contour with a width less than 5 mm and a length less than 6 mm.

16. The electret condenser microphone according to claim 6, wherein the carrier and the exterior sidewall structure are bonded together with one of an electrically conductive adhesive and solder bumps arranged on respective exposed pads of the first and second electrical traces of the carrier and exposed pads of the first and second wiring patterns at the lower surface area of the sidewall structure.

* * * * *